US009893699B2

(12) United States Patent
Zollner

(10) Patent No.: US 9,893,699 B2
(45) Date of Patent: Feb. 13, 2018

(54) SYSTEM AND METHOD FOR EXTERNAL SOUND SYNTHESIS OF A VEHICLE

(71) Applicant: Harman Becker Automotive Systems GmbH, Karlsbad (DE)

(72) Inventor: Juergen Heinrich Zollner, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 15/417,121

(22) Filed: Jan. 26, 2017

(65) Prior Publication Data

US 2017/0222612 A1    Aug. 3, 2017

(30) Foreign Application Priority Data

Jan. 28, 2016  (EP) .................................... 16153192

(51) Int. Cl.
| | |
|---|---|
| *H04B 1/00* | (2006.01) |
| *H03G 5/16* | (2006.01) |
| *G08G 1/16* | (2006.01) |
| *H04R 3/12* | (2006.01) |
| *B60Q 5/00* | (2006.01) |
| *H03G 5/00* | (2006.01) |

(52) U.S. Cl.
CPC ............. *H03G 5/165* (2013.01); *B60Q 5/006* (2013.01); *B60Q 5/008* (2013.01); *G08G 1/167* (2013.01); *H04R 3/12* (2013.01); *H03G 5/005* (2013.01); *H04R 2430/01* (2013.01); *H04R 2430/21* (2013.01); *H04R 2499/13* (2013.01)

(58) Field of Classification Search
CPC ....................................................... H04B 1/00
See application file for complete search history.

(56) References Cited

U.S. PATENT DOCUMENTS

| | | | |
|---|---|---|---|
| 2011/0093149 A1 | 4/2011 | Tanaka | |
| 2011/0199199 A1* | 8/2011 | Perkins | .................. B60Q 1/506 |
| | | | 340/435 |

(Continued)

FOREIGN PATENT DOCUMENTS

| | | |
|---|---|---|
| DE | 10201304834 A1 | 9/2014 |
| DE | 102013004834 A1 | 9/2014 |
| JP | 2007237831 A | 9/2007 |

OTHER PUBLICATIONS

European Patent Office, European Search Report Issued in Application No. 16153192.6, dated Jun. 22, 2016, Germany, 7 pages.

*Primary Examiner* — Olisa Anwah
(74) *Attorney, Agent, or Firm* — McCoy Russell LLP

(57) ABSTRACT

The present disclosure provides a system for the synthesis of external sound of a vehicle, the system comprising a hazard analysis unit configured to detect a collision hazard between the vehicle and at least one further road user, in particular an outside traffic participant; at least one electroacoustic transducer; and a sound processing unit configured to generate an audio signal representing an, in particular vehicle dependent, synthetic noise signal and to control the at least one electroacoustic transducer to output a synthetic external sound based on the audio signal, wherein the sound processing unit is configured to modify the audio signal to enhance the perceptibility of the synthetic external sound by the further road user upon detection of the collision hazard.

13 Claims, 5 Drawing Sheets

(56) References Cited

U.S. PATENT DOCUMENTS

2011/0254708 A1 10/2011 Anderson
2012/0130580 A1 5/2012 Omote et al.
2013/0094331 A1 4/2013 Watanabe et al.
2013/0154852 A1 6/2013 Kim et al.

* cited by examiner

SYSTEM AND METHOD FOR EXTERNAL SOUND SYNTHESIS OF A VEHICLE

CROSS REFERENCE TO RELATED APPLICATION

The present application claims priority to European Patent Application No. EP 16153192.6, entitled "SYSTEM AND METHOD FOR EXTERNAL SOUND SYNTHESIS OF A VEHICLE," and filed on Jan. 28, 2016, the entire contents of which are hereby incorporated by reference for all purposes.

TECHNICAL FIELD

The present disclosure relates to a system and a method for external engine/electrical sound synthesis (ESS) of a vehicle.

Background of the Disclosure

With the expected increase of the number of hybrid or purely electric vehicles on the road, the risk of accidents with outside traffic participants, such as pedestrians and cyclists, is also expected to increase due to the absence of the usual and well-known noise of combustion engines. Also now and in the future, the conventional internal combustion engine will be down-sized in order to reduce $CO_2$ emissions and will thus become even quieter. To ensure a sufficient protection for cyclists, pedestrians and persons with impaired vision and/or hearing, corresponding legal changes, in particular changes and additions to rules and regulations regarding the noise emissions from vehicles, are already being implemented or planned.

Especially for electric/hybrid vehicles, several systems to meet these rules and regulations are already in use or planned. Those systems generate additional external sound according to the specifications of the manufacturer, sometimes taking defined standards of various intuitions into account. Examples are known in:

Japan: MLIT (Ministry of Land, Infrastructure, Transport and Tourism); AVAS (Approaching Vehicle Audible System);

UN/EU: UNECE (United Nations Economic Commission for Europe); AVAS (Acoustic Vehicle Alerting System); and USA: DOT (Department of Transportation), NHTSA (National Highway Traffic Safety Administration).

It is expected that the respective legislator will specify noise levels in accordance with the noise emission standards for conventional combustion engines within comparable engine type categories and classes, as empiric evaluations have shown that artificial/synthetic sounds similar to internal combustion engines (ICE) have delivered the best results. Hereby, it is assumed that similar methods as those used for the noise level measurements will be used. Especially, the test setup will largely remain the same according to non-binding standards SAE J2889-1 or ISO 16254, which represent in practice the applicable measurement standards for vehicle exterior noise measurements for the verification of noise levels.

FIG. 1 shows the dimensions and geometry of a test site setup for exterior noise measurements for vehicles and tires according to the ISO-10844 standard, taken from the ISO-16254 standard. The test vehicle 100 is driven in a drive lane of width 3 m extending along the line C-C'. The standard specifies requirements for the drive lane with respect to the material, the surface texture, the acoustic absorption and the evenness. The level of the emitted noise is measured by two microphones 110a and 110b provided at 1.2 m height in the propagation area which is shown in the Figure as a 20 m×20 m square with corner points A, A', B and B'. The standard further specifies the requirements for the propagation area with respect to acoustic absorption and evenness. The microphones 110a and 110b are symmetrically placed on either side of the line C-C' along the central line P-P' and set apart by 4 m. Around the center of the propagation area, a circular area with radius of 50 m is kept free of reflecting objects to avoid an impact on the measurements.

The described setup is widely accepted by experts as suitable for the measurement of vehicle noise emission. It, however, takes only one specific traffic situation into account and only allows variation of vehicle speed as a parameter.

Empirical studies carried out by the NHTSA and summarized in the document NTHSA-2011-0148 shows that the minimum required noise level for the acoustic perception of a vehicle passing by a pedestrian or cyclist ranges, depending on vehicle speed and vehicle condition, around 49 dB (A), but should be 66 dB (A) for the safety of the traffic participant. Table 1 shows the minimum vehicle noise level required for acoustic perception.

| Vehicle Speed | A-weighted SPL measured at P-P' line |
|---|---|
| Stationary, but activated | 49 [dB (A)] |
| Backward movement | 52 [dB (A)] |
| 10 [km/h] | 55 [dB (A)] |
| 20 [km/h] | 62 [dB (A)] |
| 30 [km/h] | 66 [dB (A)] |

To ensure the safety of outside traffic participants, the required noise emissions by a hybrid/electric vehicle would be equally harmful to the environment as those of a conventional combustion engine. In addition, the present specifications only guarantee a sufficient noise level in the measurement locations along the line P-P'.

The NHTSA report DOT HS 811 304 further indicates that, starting from a speed of approximately 30 km/h, the tire noise takes the "lion's share" of the total noise emissions. As a consequence, artificial/synthetic external noise generation becomes unnecessary at vehicle speeds above 30 km/h.

It shall be noted that the reduced acoustic perception and acoustic visibility is not limited to electric/hybrid vehicles but that even conventional vehicles, e.g. with down-sized engine power, could not be detected by a significant number of blind persons in time.

In addition, the measurements for the required noise emissions do not take the influence of environmental noise into account. If at all, a standardized noise spectrum is superposed onto measurement results as environmental background noise. Such an approach will, however, not cover a real traffic situation. Especially at low vehicle speed, the effectiveness of synthetic external sound is widely dependent on overlapping environmental noise. Existing systems, which do not include solutions for the above described limitations, can therefore provide only suboptimal results.

The methods and systems according to the present disclosure therefore aim at overcoming the above described limitations and at improving the safety of outside traffic participants with minimum noise pollution.

SUMMARY OF THE DISCLOSURE

The technical problems described above are solved by a system for the synthesis of external sound of a vehicle, wherein the system comprises: a hazard analysis unit configured to detect a collision hazard between the vehicle and at least one further road user, in particular an outside traffic participant; at least one electroacoustic transducer; and a sound processing unit configured to generate an audio signal representing an, in particular vehicle dependent, synthetic noise signal and to control the at least one electroacoustic transducer to output a synthetic external sound based on the audio signal, wherein the sound processing unit is configured to modify the audio signal to enhance the perceptibility of the synthetic external sound by the further road user upon detection of the collision hazard.

In general, the vehicle is a road vehicle such as a truck, a car or a motorcycle and may in particular be an electric or a hybrid vehicle. The vehicle may however also be a vehicle with a regular combustion engine, if the low intrinsic noise emission of the combustion engine, e.g., due to its reduced power, makes an external sound synthesis desirable. Here and in the following, the term "synthetic external sound" refers to an external sound of a vehicle which is artificially produced by outputting a specifically generated audio signal using at least one electroacoustic transducer, e.g. loudspeaker.

To this end, the described system comprises a sound processing unit configured to generate an audio signal representing an, in particular vehicle dependent, synthetic noise signal and to control the at least one electroacoustic transducer to output a synthetic external sound based on the audio signal. The audio signal may be analog or digital. Accordingly, the sound processing unit may comprise corresponding units like amplifiers, filters, signal combiners, such as mixers, inverters, delay elements and the like to process the audio signal with respect to gain, volume, spectral distribution, phase, directivity and/or temporal variation. Depending on the audio signal, the corresponding units are provided for analog or digital signal processing. Furthermore, A/D and/or D/A converters may be used. Such signal processing units and elements are well known in the art such that a detailed description is omitted to avoid obscuring the present disclosure. The sound processing unit may in particular comprise a digital signal processor (DSP) adapted to process a digital audio signal. It shall be understood that a plurality of sound processing units may be provided to carry out subsequent sound processing steps or parallel sound processing steps on the audio signal. Equally, the term audio signal is used here and in the following for both single-channel audio signals and multi-channel audio signals. The latter may for instance be processed with respect to a phase relationship between individual channels of the signal and/or a directivity of the emitted acoustic signal.

According to the present disclosure, the generated audio signal represents a synthetic noise signal of a vehicle. The synthetic noise signal may in particular fulfill the above described legal requirements with respect to sound characteristic and sound level and may be based on the noise spectrum of a conventional combustion engine. In addition, the synthetic noise signal may follow a vehicle type, brand and/or make dependent sound image and characteristic designed by the original equipment manufacturer (OEM). Thus, even though the generated external sound is artificial, it may still reflect an image of the corresponding vehicle, such as a sports car, an SUV or a truck, to allude to acoustic associations of the outside traffic participant.

The sound processing unit is further configured to control the at least one electroacoustic transducer to output a synthetic external sound based on the audio signal. This may include simply outputting the generated (and modified) audio signal to the at least one electroacoustic transducer, but may also include controlling a direction in which the external sound is emitted, e.g. by controlling one or more actuators which rotate a speaker or a reflector. Detailed examples for the control of electroacoustic transducers are given further below.

The at least one electroacoustic transducer may comprise one or more loudspeakers, both steered and un-steered, one or more ultrasonic transducers, one or more electro-dynamic planar loudspeakers (EDPL), a beamforming assembly of two or more loudspeakers, or any other electroacoustic transducer known in the art. Specific examples are given below in connection with specific aspects of the present disclosure.

The present disclosure includes outputting different synthetic external sounds according to whether a collision hazard between the vehicle and a further road user has been detected or not. The further road user may be another vehicle, but may in particular be an outside traffic participant, such as a pedestrian or a cyclist. A collision hazard between the vehicle comprising the described system and at least one further road user exists, if, based on the positions and optionally state of motion of the vehicle and the further road user, a calculated probability of the vehicle colliding with the further road user exceeds a collision detection threshold. Systems for detecting a collision hazard, i.e. predicting an imminent collision, are well known in the art as precrash systems, forward collision warning systems or collision mitigating systems. They may be as simple as a parking distance control system or very intricate using a plurality of sensors, e.g. radar, laser, optical, camera, etc., to predict an imminent collision. In general, these system predict collisions with any kind of object, i.e. including stationary objects such as parked cars, walls, poles, etc. The present disclosure may however use a refined system that limits the detection of a collision hazard to other road user, i.e. operated vehicles or pedestrians.

This refinement can be achieved by adding a detection unit configured to detect other road users. Such a detection unit may use pattern recognition techniques, both for the detection of human shapes or features, such as face detection, and for the detection of other vehicles, and consequently employ an image sensor. Other options include thermal imaging using an infrared sensor or motion analysis for the detection of a proper motion of the road user. A plurality of systems and methods are known in the art for distinguishing between a stationary, inanimate object and road users. A minimum requirement for the present system may be given by the capability to detect moving and optionally stationary pedestrians. Based on the environmental data, captured using any of the above mentioned sensors, the hazard analysis unit calculates a collision probability, i.e. determines whether a collision hazard exists.

If such a collision hazard exists, the audio signal is modified by the sound processing unit to enhance the perceptibility of the synthetic external sound by the further road user. Here and in the following, the term "perceptibility" may be understood with respect to a 'normal' hearing ability of a human being. Although a plurality of definitions for 'normal' hearing exist in the art, they all allow to distinguish between an enhanced perceptibility and an unmodified perceptibility of the modified and the unmodified audio signal, respectively. In any case, the audio signal may be modified such that a majority of human listeners would perceive the enhanced synthetic external sound better than in the unmodified case. The perceptibility may in particular be increased for an outside traffic participant position at the location of one of the microphones 110 a and 110 b in the test setup of FIG. 1. Advantageously, it may also be increased if the outside traffic participant is positioned at an arbitrary position along the line P-P' in FIG. 1. Even more advantageously, the perceptibility may be enhanced for an outside traffic participant at an arbitrary position inside the propagation area of FIG. 1.

The present disclosure thus provides a flexible and adaptive solution to the above described problem of increasing the safety of passive road users without unduly increasing the noise pollution by vehicles. Upon detection of a collision hazard, a basic synthetic external sound, in particular an un-steered external sound, may be enhanced, e.g. its volume may be increased, and/or an additional synthetic external sound, in particular a steered external sound, may be added to alert the passive road user of the approaching vehicle. This may in particular increase the safety of visually impaired pedestrians.

Reciprocally, the basic synthetic external sound, which so far corresponded to the standardized requirements in volume and spectral distribution, may be lowered in case no collision hazard is detected. The described system thus allows for a reduction in the overall noise emission by dynamically adapting the emitted noise signal. By increasing the noise emission according to the current traffic situation, i.e. only in case of threat to life or physical integrity of the outside traffic participant, the overall noise emission is significantly reduced such that the maximum permitted emission in a hazardous situation may even be selected to exceed the noise level of a conventional system.

By distinguishing between stationary, inanimate objects and road users, the present system further avoids unnecessary noise emission if a collision hazard with a stationary object is detected. Furthermore, the system may distinguish between outside traffic participants and other motorized vehicles and modify the audio signal accordingly. According to one aspect, the audio signal may only be modified for enhanced perceptibility of outside traffic participants.

A plurality of ways to modify the audio signal to enhance its perceptibility exists. As an example, the volume of the entire audio signal may be increased. Such an increased gain of the entire spectrum of the audio signal leaves the sound image and characteristic of the unmodified audio signal, as designed by an OEM, unchanged. Alternatively or additionally, selected spectral components, e.g. frequencies above 1 kHz, may be boosted to warn in particular hearing impaired pedestrians. Furthermore, the emitted synthetic external sound may be steered toward the road user, for which the collision hazard was detected, e.g. by adapting the directivity of a steered signal to the position of the road user. This can for instance be achieved by adjusting the relative phase between individual channels of the audio signal in a beamforming process or the like. Also, a temporal variation of the synthetic external sound may be applied or modified. Also, periodic variations of the audio signal in volume and/or in pitch of the spectral distribution may be applied to the audio signal. Other modifications which are suited to attract the attention of the further road user are possible too. Finally, any combination of the above described modifications can be applied to the audio signal.

According to a further aspect, the hazard analysis unit may comprise at least one sensor configured to capture data from objects in the surroundings of the vehicle and an object tracking unit configured to determine positional and/or motional information of at least one object in the surroundings of the vehicle from the captured data, wherein the hazard analysis unit is configured to detect the collision hazard between the vehicle and the further road user based on the determined positional and/or motional information. Here and in the following, the term "object" is used without limitation for both inanimate objects, such as vehicles or poles, and persons, such as pedestrians and cyclists.

As mentioned above, the at least one sensor can be any sensor configured to capture data with respect to a position and/or movement of an object in the surroundings of the vehicle. By way of example, radar sensors, laser sensors and/or infrared sensors may be used. In addition or alternatively, optical sensor such as cameras may be used which may additionally provide image data to a detection unit configured to detect other road users, as described above. Such a detection unit may be part of the hazard analysis unit. From the captured data, the object tracking unit determines positional and/or motional information of the object which may be used to detect a collision hazard between the vehicle and the object. To this end, the hazard analysis unit may further comprise sensors which are configured to capture vehicle data and/or may receive such vehicle data from corresponding sensors of the vehicle. The vehicle data may include but is not limited to a current speed, gear information, direction (forward/backward), acceleration/deceleration, vehicle dimensions and mass, vehicle position (such as GPS data or relative position with respect to road delimiters, e.g. curb, center line, etc.) and driving inputs (such as blinker left or right, steering angle, emergency break, etc.).

The object tracking unit may be adapted to determine a position of one or more objects in the surroundings of the vehicle relative to the vehicle. In addition, the object tracking unit may determine a direction of movement, a speed and/or acceleration/deceleration of a movement of the tracked object. From this data, the hazard analysis unit may calculate a predicted trajectory of the object and compare it with a predicted trajectory of the vehicle. Based on the comparison, a collision probability may be calculated and a collision hazard may be detected. As mentioned above, a detection unit of the hazard analysis unit may identify or classify the tracked object(s) and may in particular distinguish between inanimate obstacles and outside traffic participants. Other motorized vehicles may form a specific class which may be further divided into closed cabin vehicles and motorcycles. For the latter, the modification of the audio signal upon detection of a collision hazard may be triggered while such a modification is omitted for the former. Alternatively, the modification may be triggered for any outside traffic participant, stationary or not, and for any non-stationary motorized vehicle. Image processing algorithms, such as face detection algorithms, may be used as part of the classification process. The hazard analysis unit may be configurable with respect to the classes of objects and/or traffic situations which trigger an enhancement of the external sound to avoid excessive warning of roadside pedestrians. In an extreme case, the enhancement may only be triggered for a detected collision hazard with children.

The complexity of the hazard analysis unit and the object tracking unit may vary, depending on the price segment of the vehicle and market expectations, from a simple evaluation of parking distance control data, systems used for emergency breaking to systems used in self-managed driving. Also, the sector of the surroundings of the vehicle which is scanned for objects potentially creating a collision hazard may be restricted to a cone with an opening angle, which depends on the speed of the vehicle, and its axis in the current driving direction. A higher speed may result in a narrower cone. By restricting the sector of the surroundings to be scanned, the number of false positive detections of a collision hazard may be reduced.

According to a further aspect, the sound processing unit may comprise an un-steered sound processing unit configured to control the at least one electroacoustic transducer to output an un-steered synthetic external sound based on the modified audio signal upon detection of the collision hazard. Here and in the following, an un-steered sound emission refers to a sound emission in a fixed orientation with respect to the installation geometry, and is not limited to a homogeneous omni-directional sound emission. In fact, the at least one electroacoustic transducer will advantageously be located somewhere near the front (and additionally near the rear) of the vehicle to emit sound in the driving direction. Also, the at least one electroacoustic transducer may very well have a directional sound emission characteristic and may even be configured to steer the emitted sound in a particular direction. However, the un-steered sound processing unit does not actively influence this characteristic or actuate a steered electroacoustic transducer. In most cases, the un-steered sound processing unit will simply output the modified audio signal to the at least one electroacoustic transducer which in return emits the un-steered synthetic external sound. Using an un-steered sound processing unit thus represents a simple and inexpensive option of providing a traffic situation dependent external sound generator.

According to a further aspect, the sound processing unit may comprise a steered sound processing unit configured to control the at least one electroacoustic transducer to output a steered synthetic external sound in a direction of the further road user based on the modified audio signal and the determined positional and/or motional information upon detection of the collision hazard. From the determined positional and/or motional information, the steered sound processing unit may determine a direction and optionally a distance of the further road user with respect to the vehicle. The steered sound processing unit then controls the at least one electroacoustic transducer to output a steered synthetic external sound in the determined direction, wherein the volume of the emitted sound may be adjusted according to the determined distance. A steered sound may be emitted in a variety of ways. One option is to achieve beamforming by creating a time delay or phase shifting between two or more signals emitted by different loudspeakers, wherein the time delay or phase shift is selected in such a way that the emitted sound waves interfere positively at the location of the further road user. Alternatively, multi-channel beamforming may be achieved by applying individual complex filters to the multi-channel signals. A multi-channel audio signal may be modified accordingly by the steered sound processing unit.

Alternatively or additionally, the at least one electroacoustic transducer may include one or more steered electroacoustic transducers such as steered loudspeakers which can be turned mechanically or loudspeakers having a parabolic acoustic reflector which can be turned mechanically. In this case, the steered sound processing unit may control the mechanical actuators to turn the loudspeaker/reflector in the direction of the further road user. Also ultrasonic loudspeakers can provide good directivity of the emitted sound through nonlinear acoustics. A special variant may use electro dynamic planar loudspeakers (EPDL) to emit a focused sound. In either case, mechanical actuators may be used to change the direction of the sound emission.

The simplest way of achieving a steering of the emitted external sound may be the adjustment of the gain of the audio signals to be output by different electroacoustic transducers, e.g. located near the corners of the vehicle, individually with respect to the detected direction of the further road user. This approach allows enhancing the emitted signal on one side of the vehicle, for instance the side of the sidewalk, without affecting the other side of the vehicle.

The at least one electroacoustic transducer may be controlled by the sound processing unit to emit both un-steered and steered external sound at the same time. To this end, the sound processing unit may combine an un-steered audio signal component produced by the un-steered sound processing unit and a steered audio signal component produced by the steered sound processing unit assigned to one or more electroacoustic transducers. By way of example, the un-steered audio signal component may be an underlying basic audio signal which is output independently of whether a collision hazard is detected, while the steered audio signal component may be particularly generated for the purpose of warning another road user. It shall be emphasized that the steered audio signal component may in particular be a modified version of the above described vehicle dependent basic audio signal such that the steered synthetic external sound still follows the characteristic sound image of the particular vehicle.

According to yet another aspect, the sound processing unit may (further) comprise a metadata unit configured to selectively attenuate the audio signal based on vehicle metadata, wherein the vehicle metadata includes at least one of a time of day, a date, vehicle position data and traffic sign data. The selective attenuation may be performed on the audio signal before or after processing by the sound processing unit. It may be overruled by the sound processing unit upon detection of a collision hazard to ensure the safety of outside traffic participants or may be applied in any case if the vehicle metadata indicate such an attenuation to reduce the overall noise pollution.

It may be desirable to reduce the synthetic noise emissions in special time and/or location related situations such as at night, in residential areas, in traffic-calmed areas or noise protected areas. Such situations may be identified by the metadata unit based on a time of day, a date, vehicle position data and/or traffic sign data. To acquire the relevant data, the metadata unit may be connected to a head-unit of the vehicle and its navigation system. The vehicle position data may be based on GPS data and combined with information from a database of the navigation system. The traffic sign data may be based on camera image data processed by a traffic sign recognition unit. If a predetermined special time and/or location related situation is detected, for which a reduction of the noise emission is desirable or mandatory, the metadata unit attenuates or spatially modifies the audio signal.

In particular, the metadata unit may be configured to reduce an amplitude of the entire audio signal or of selected spectral components of the audio signal based on the vehicle metadata. As an example, the metadata unit may be configured to reduce only the high frequency components of the audio signal if a special time and/or location related situation is detected. Also, the metadata unit may be configured to attenuate only the un-steered audio signal components while it leaves the steered audio signal components unchanged. Also the complete impact by the metadata unit may be disabled in case no steered audio signal component is available and reducing the un-steered signal component would be insufficient to perform its alert function (safety first). By adding the above described metadata unit to the sound processing unit, an overall noise pollution may be reduced without affecting the safety of outside traffic participants.

According to a further aspect, the sound processing unit may (further) comprise a noise processing unit configured to selectively amplify the audio signal based on information about an external noise level. The noise processing unit may in particular be configured to amplify the audio signal if an external noise level exceeding a predetermined threshold is detected. Alternatively or additionally, a gain factor applied to the audio signal by the noise processing unit may be increased with increasing external noise level. To measure the external noise level, the system may include one or more external microphones configured and positioned with respect to the vehicle such that they can measure an external noise level and/or spectrum. The noise processing unit may further be configured to estimate the external noise by extracting error signals resulting from the noise generated by the vehicle itself. Alternatively or additionally, the estimation may be based on standardized noise measurements stored in a database of the synthetic external sound system and/or on the (modified) audio signal which is output by the at least one electroacoustic transducer.

The noise processing unit may be configured to amplify the entire audio signal or only selected spectral components of the audio signal. The noise processing unit may further apply a psychoacoustic model to the audio signal to balance the loudness of the synthetic external sound with respect to the characteristics of the human hearing. In addition to the data received from the one or more external microphones, the noise processing unit may use vehicle data including speed, gear information, direction (forward/backward) and the like, to estimate the vehicle generated intrinsic noise.

The system for the synthesis of external sound may comprise a plurality of further components. In particular, an external sound generation unit may be provided which is configured to generate a predefined basic audio signal which represents the sound image of the particular vehicle type, make and/or model. The basic audio signal may be read from a nonvolatile memory or any other storage medium or may be generated based on vehicle data such as speed, longitudinal acceleration and/or gear information to provide the illusion of the sound of a combustion engine matching the brand image of the vehicle. The generated basic audio signal may form the basis for the above described sound processing by the sound processing unit.

The present disclosure also provides a method for the synthesis of external sound of a vehicle, the method comprising: generating an audio signal representing an, in particular vehicle dependent, synthetic noise signal; performing a hazard analysis to detect a collision hazard between the vehicle and at least one further road user, in particular an outside traffic participant; and controlling at least one electroacoustic transducer of the vehicle to output a synthetic external sound based on the audio signal, wherein the audio signal is modified to enhance the perceptibility of the synthetic external sound by the further road user upon detection of the collision hazard.

Equivalent modifications and extensions as described above with respect to the external sound synthesis system may also be applied to the external sound synthesis method. In particular, a basic audio signal may be generated which represents a characteristic sound image of a particular vehicle type, make and/or model. The basic audio signal may be read from a nonvolatile memory or any storage medium or may be generated based on vehicle data such as speed, longitudinal acceleration and/or gear information. The basic audio signal may be used for the generation of a basic synthetic external sound which is generally output independently of whether a collision hazard is detected. The basic synthetic external sound may, however, be adapted to the vehicle speed such that the output volume increases with increasing vehicle speed. Also, output of the synthetic external sound, modified or not, may be limited to vehicle speeds below a maximum speed, e.g. 30 km/h, above which the vehicle's intrinsic noise due to wind friction and tires dominates the noise emission.

According to the present method, the generated audio signal is modified to enhance the perceptibility of the synthetic external sound by a further road user upon detection of a collision hazard between the vehicle and the further road user. As a consequence, at least two different situations may arise: If no collision hazard is detected, a basic synthetic external sound is output based on the unmodified audio signal, which may in particular have a lower volume than required by the above mentioned standards. If a collision hazard is detected, a synthetic external sound with enhanced perceptibility is output based on a modified audio signal.

As discussed above, the perceptibility of the synthetic external sound may be enhanced by modifying at least one of a volume, a spectral distribution, a phase, a directivity and a temporal variation of the synthetic external sound through corresponding modification of the audio signal. The audio signal may in particular be gradually modified as the vehicle approaches the road user for whom a collision hazard has been detected. By way of example, a volume of the audio signal may be gradually increased from the detection of the collision hazard to the moment that the vehicle reaches the line P-P' in FIG. 1, for a road user located along this line. After passing the line, the volume may be abruptly or gradually returned to the background level, i.e.

the level of the basic synthetic external sound. This approach exaggerates the natural increase in perceived volume upon approach of a vehicle and thus increases the safety of outside traffic participants. Alternatively, the volume may be abruptly increased upon detection of the collision hazard and kept constant until the line P-P' is reached. This may help to further increase the safety of visually impaired pedestrians as it gives the impression of a closer proximity of the approaching vehicle. The audio signal may further be modified by modifying its spectral distribution according to a relative position of the vehicle and the further road user with respect to the driving direction of the vehicle. Particularly, the spectral distribution may be modified in order to exaggerate the intrinsic Doppler effect of an approaching vehicle. Any other modifications, which are suitable for giving extra and helpful information to other road users, may be carried out.

As described in detail above, the method may further comprise capturing data from objects in the surroundings of the vehicle by at least one sensor of the vehicle and determining positional and/or motional information of at least one object in the surroundings of the vehicle from the captured data, wherein the collision hazard between the vehicle and the further road user is detected based on the determined positional and/or motional information. The sensors may include radar, laser, infrared and/or optical sensors such as cameras. The captured data may be pre-processed, for instance by applying pattern recognition techniques to captured image data. In addition, vehicle data such as a current speed, gear information, direction (forward/backward), acceleration/deceleration, vehicle dimensions and mass, vehicle position (such as GPS data or relative position with respect to road delimiters, e.g. curb, center line, etc.) and driving inputs (such as blinker left or right, steering angle, emergency break, etc.) may be received from corresponding sensors and/or a head unit of the vehicle.

The method may further include tracking the at least one object using the determined positional and/or motional information. In particular, a direction of movement, a speed and/or acceleration/deceleration of a movement of the tracked object may be determined. From this data, a predicted trajectory of the object may be calculated which may be compared with a predicted trajectory of the vehicle. Based on the comparison, a collision probability may be calculated and a collision hazard may be detected. As mentioned above, the tracked object(s) may be identified and classified. It may in particular be distinguished between inanimate obstacles and outside traffic participants.

Also at least one electroacoustic transducer of the vehicle may be controlled to output an un-steered synthetic external sound based on the modified audio signal upon detection of the collision hazard as described above. Alternatively or additionally, the at least one electroacoustic transducer of the vehicle may be controlled to output a steered synthetic external sound in a direction of the further road user based on the modified audio signal and the determined positional and/or motional information upon detection of the collision hazard. The same variants as described above may be employed. In particular, beamforming of the emitted sound in the direction of the further road user may be performed. Also, directional electroacoustic transducers may be mechanically turned into the direction of the further road user.

As described above, the method may further comprise selectively attenuating the audio signal based on vehicle metadata, wherein the vehicle metadata includes at least one of a time of day, a date, vehicle position data and traffic sign data. The vehicle metadata may be acquired from a head unit of the vehicle and its navigation system. Based on the vehicle metadata, special time and/or location related situations, which require a reduction of the noise emissions, such as at nighttime, in residential areas, in traffic-calmed areas or noise protected areas, may be detected. Consequently, unnecessary noise pollution can be avoided. In a critical situation, the impact may be over-ruled and disabled.

According to a specific aspect of the disclosed method, the entire audio signal or selected spectral components of the audio signal may be attenuated based on the vehicle metadata. Also, the audio signal may be selectively amplified based on information about an external noise level and/or noise spectrum. The information may be collected using one or more external microphones mounted on the vehicle. The captured external noise may be estimated by extracting the noise generated by the vehicle itself, wherein the relevant data may be pre-calculated and stored in a database of the vehicle, as described above. Alternatively or additionally to an amplification of the audio signal, a psychoacoustic model may be applied to the audio signal to counteract the impact of existing external noise on the human perception.

The present disclosure also provides a computer program product, comprising one or more computer readable media having computer-executable instructions for performing the steps of any of the above described methods.

The described systems and methods minimize the synthetic noise emission of hybrid/electric vehicles while at the same time improving the passive safety of outside traffic participants. The relative quietness of the vehicle thus benefits the brand image, while a characteristic sound image is maintained. Also, the flexible and adaptive control of the synthetic noise emission facilitates the compliance with rules and regulations by the legislators.

According to the disclosure, steered and un-steered synthetic noise emission is controlled by object tracking and collision avoidance systems and methods. In the un-steered mode, synthetic external sound may be emitted only when required. In the steered mode, the emitted synthetic external sound can be boosted according to the current traffic situation. Thus, there is only a need to increase noise emissions in case of threat to life or physical integrity. Furthermore, using time and location related information may allow meeting noise requirements which may be enforced in pedestrian zones or at nighttime, without compromise to the protection of traffic participants.

As the system can combine steered and un-steered sound emission independently, the risk of complete system failure can be lowered. Also, the synthetic external sound may be enhanced without changing the specific sound image and characteristic designed by an OEM for a specific vehicle.

Compared to existing systems for synthetic noise generation, the described systems and methods provide at least the following benefits: As the noise emission is reduced compared to systems with constant noise emission or noise emission regulated according to vehicle speed, the enhanced system improves the overall quality of life. Also, the system provides an improvement for the passive safety as compared to conventional systems. Additionally, the green/environmental benefits of electric/hybrid vehicles do not only rely on reduced $CO_2$ emissions but may also be achieved by minimum required noise emission.

Further features and exemplary embodiments as well as advantages of the present disclosure will be explained in detail with respect to the drawings. It shall be understood that the present disclosure should not be construed as being limited by the description of the following embodiments. It shall furthermore be understood that some or all of the features described in the following may also be combined in alternative ways.

DETAILED DESCRIPTION

In the figures, identical reference signs indicate identical or similar components.

Figure 1:
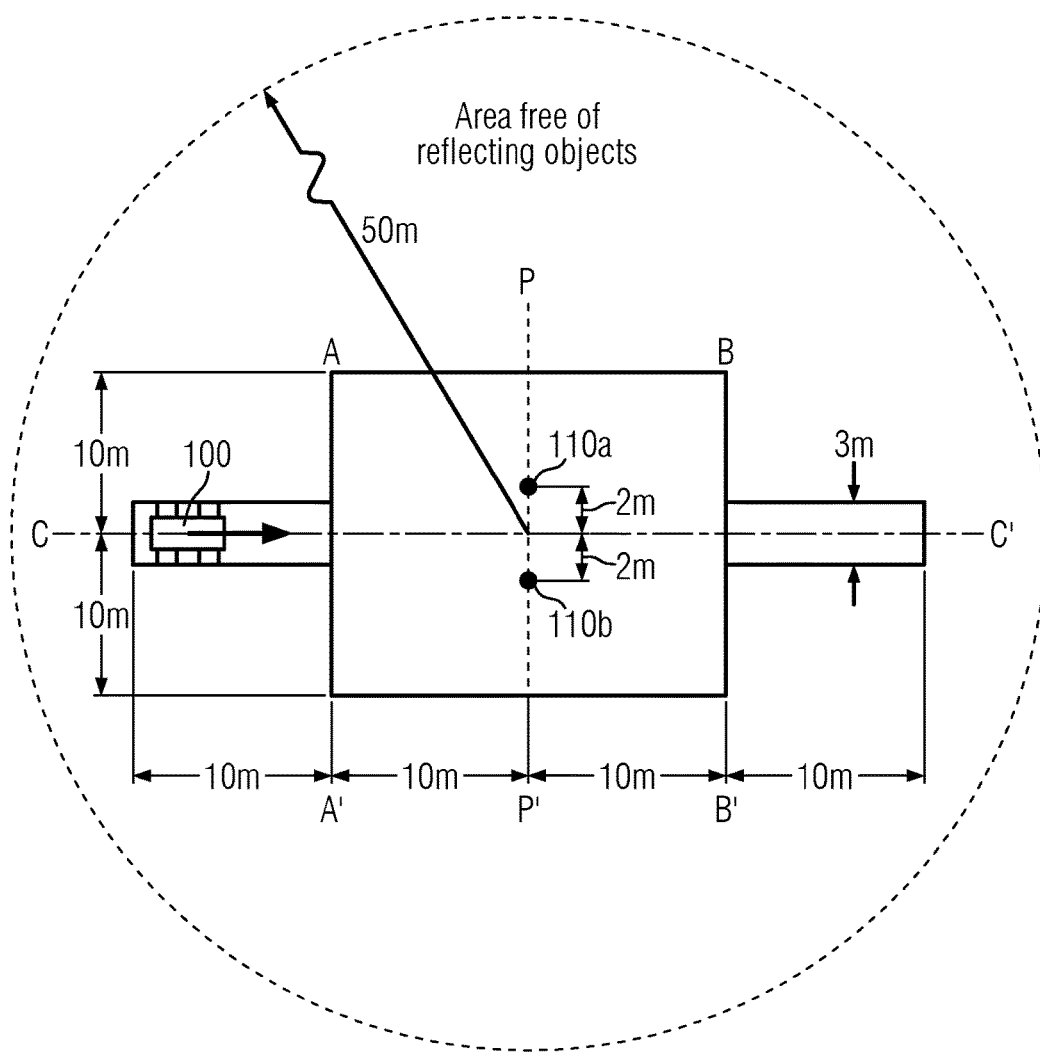
FIG. 1 shows the dimensions and geometry of a test site setup for exterior noise measurements for vehicles and tires according to the ISO-10844 standard.
Figure 2:
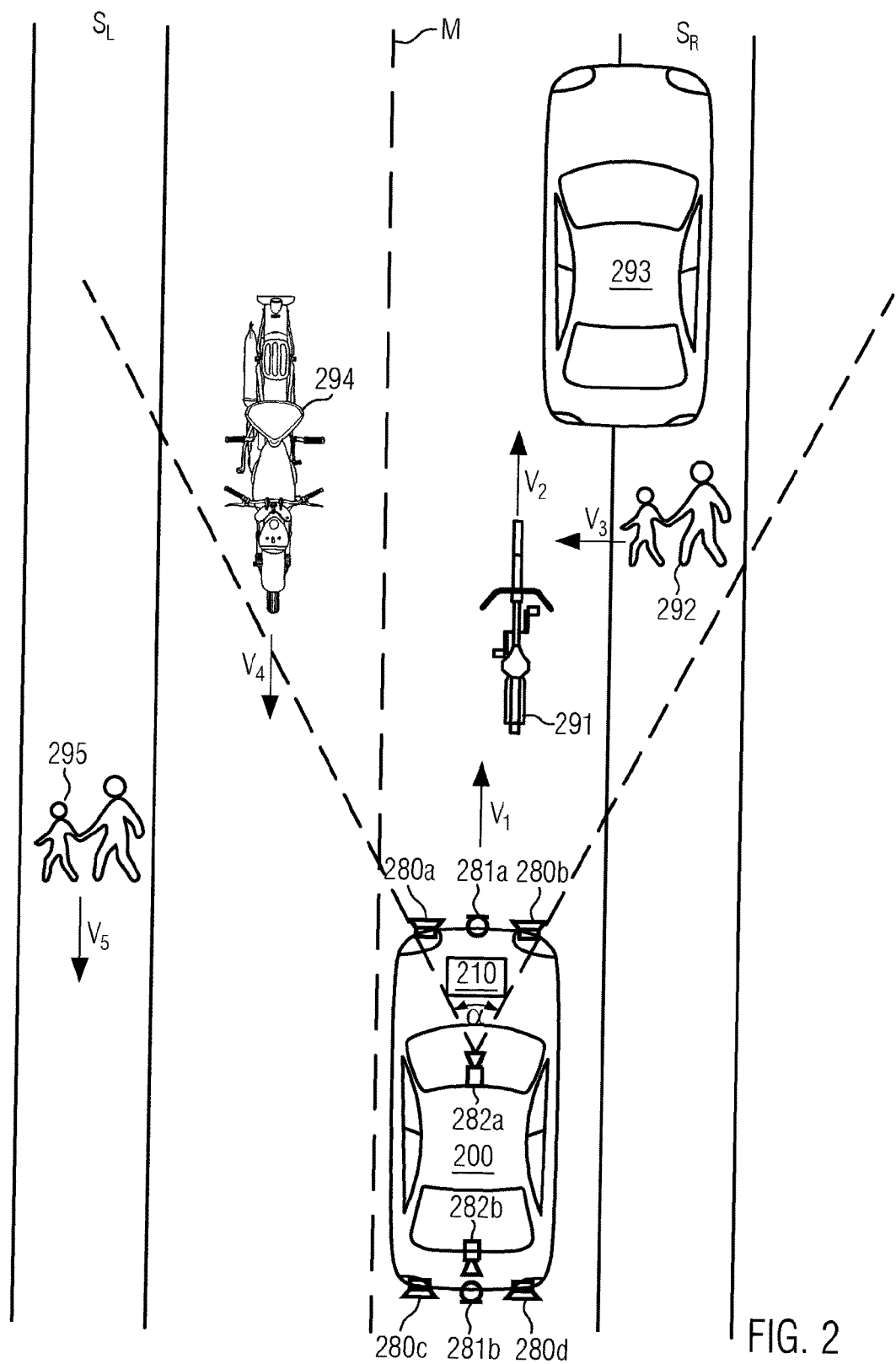
FIG. 2 shows an exemplary traffic situation and a schematic representation of a vehicle equipped with the external sound synthesis system according to the present disclosure.

FIG. 2 shows an exemplary traffic situation which may serve as a demonstration for the principle of the system and method for the synthesis of external sound of a vehicle according to the description above. It shall be understood that the depicted traffic situation is not to be regarded as limiting but merely serves to demonstrate various aspects of the external sound synthesis system.

A vehicle 200, for instance a hybrid or electric car, is equipped with an external sound synthesis system. In addition to a processing unit 210, which may comprise the above described hazard analysis unit and sound processing unit, the schematically illustrated system comprises one or more electroacoustic transducers 280a-d, e.g. loudspeakers, among which two transducers 280a and 280b may be mounted at the corners of the front apron or bumper while two further transducers 280c and 280d may be mounted at the corners of the rear apron or bumper of the vehicle 200. It shall be understood that, depending on the type of the transducers and the characteristics of the emitted external sound, fewer or more electroacoustic transducers may be provided. By way of example, a single transducer may be located in each of the front and rear apron/bumper along a center line of the vehicle 200. By being integrally mounted in the apron/bumper, the electroacoustic transducers are protected against splash water. Typically, working ranges of the transducers lie between 100 Hz and 10 kHz. As described above, the sound synthesis system may comprise both un-steered and steered electroacoustic transducers.

In addition, the exemplary external sound synthesis system of the vehicle 200 comprises external microphones 281a and 281b located at the front and rear aprons/bumpers. Again, fewer or more external microphones may be provided to measure an external noise level and/or spectrum. Furthermore, the system comprises a front view camera 282a and a rear view camera 282b. As the vehicle 200 is moving forward with a velocity $v_1$, the front view camera 282a is activated to provide image data to the hazard analysis unit, in particular the object tracking unit of the external sound synthesis system. It shall be understood that any of the shown components may additionally serve other purposes when operating a vehicle, such as a car, and may thus be integrated with the vehicle's head unit and/or infotainment system.

The front view camera 282a is shown with a viewing angle $\alpha$, which may simply be given by the camera's viewing angle. According to a specific aspect of the present disclosure, the angle $\alpha$ may however represent an opening angle of the above described cone defining the detection sector of the object tracking unit. In other words, objects and in particular other road users, such as the pedestrians 292 on the right-hand side sidewalk $S_R$, the bicycle 291 in the driving lane of the vehicle 200, the parked vehicle 293 and the motorcycle 294 in the opposite lane of the road with central line M, may be detected and tracked by the object tracking unit as they are positioned inside the detection sector while other objects and road users, such as the pedestrians 295 on the left-hand side sidewalk $S_L$, are not detected as they are positioned outside the detection sector. The opening angle $\alpha$ of the cone may be varied by the sound synthesis system according to the velocity $v_1$ of the vehicle 200. In particular, the angle $\alpha$ may be reduced for a higher vehicle speed $v_1$ since the car 200 cannot deviate from its present course by large angles at higher speed and since the time for the vehicle 200 to reach the level of the pedestrians 292 decreases with higher speed such that the distance traveled by the pedestrians 292 in the same time, which has to be taken into account when performing the collision hazard analysis, is also reduced. Reducing the opening angle $\alpha$ with increasing velocity $v_1$ reduces the number of false positives of the collision hazard analysis and diminishes the amount of data to be processed.

Figure 3:
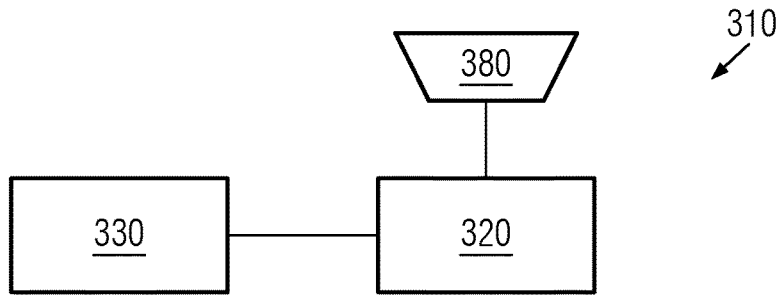
FIG. 3 illustrates the principle of the external sound synthesis system according to the present disclosure.

FIG. 3 shows a basic configuration of the external sound synthesis system according to the present disclosure. As fundamental components, the exemplary external sound synthesis system 310 comprises one or more electroacoustic transducers 380, a hazard analysis unit 330 and a sound processing unit 320. As described above, the hazard analysis unit 330 scans the environment of the vehicle for potential collision hazards with further road users, in particular outside traffic participants.

Figure 4:
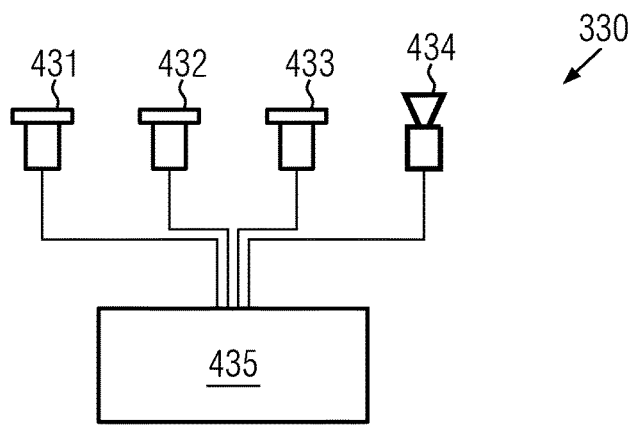
FIG. 4 shows an exemplary embodiment of a hazard analysis unit according to the present disclosure.

An exemplary embodiment of the hazard analysis unit 330 is shown in FIG. 4. In this embodiment, the hazard analysis unit 330 comprises one or several sensors 431 to 434 configured to capture data from objects in the surroundings of the vehicle 200 and an object tracking unit 435 configured to determine positional and/or motional information of at least one object in the surroundings of the vehicle 200 from the captured data. By way of example, the hazard analysis unit 330 may comprise a radar or ultrasonic sensor 431 and/or a laser sensor 432 for actively probing the vehicle's environment inside the detection sector, such as in parking distance systems, an infrared sensor 433 for receiving infrared data from other vehicles and in particular from human beings, and/or one or several cameras 434 for capturing image data of the detection sector. The captured data is processed by the object tracking unit 435 in order to determine positional and/or motional information of objects in the detection sector.

FIG. 2 gives a few examples for such objects/road users. The object tracking unit 435 determines the position and speed $v_2$ of a bicycle 291 moving in the same direction as the vehicle 200, the position and speed $v_3$ of pedestrians 292 on the sidewalk about to enter the road in front of the vehicle 200, the position of a stationary, i.e. parked, vehicle 293 blocking the current path of the vehicle 200, and the position and speed $v_4$ of a motorcycle 294 driving in the opposite direction as the vehicle 200. Other sensors, such as a side view camera (not shown) may further detect the position and speed $v_5$ of pedestrians 295 walking along the left-hand side sidewalk. As the sensors may further be configured to continuously or periodically capture data from the surrounding of the vehicle, the object tracking unit 435 may further determine an acceleration/deceleration of the movements of tracked objects, in addition to the speed and direction of their movements. As mentioned above, the hazard analysis unit 330 may further comprise sensors (not shown) which are configured to capture vehicle data and/or may receive such vehicle data from corresponding sensors of the vehicle 200. The vehicle data may for instance include a current speed, gear information, direction (forward/backward), acceleration/deceleration, vehicle dimensions and mass, vehicle position (such as GPS data or relative position with respect to road delimiters, e.g. curb, center line, etc.) and driving inputs (such as blinker left or right, steering angle, emergency break, etc.).

Based on the vehicle data, the object tracking unit 435 may calculate a trajectory of the vehicle 200. Likewise, the object tracking unit 435 may calculate a trajectory of the tracked objects based on the determined positional and motional information. From the calculated trajectories—or directly from the determined positional and/or motional information—the hazard analysis unit 330 may calculate a probability of a collision between the vehicle 200 and the tracked object and provide corresponding collision hazard information to the sound processing unit 320. The collision hazard information may for instance include information on the relative position, e.g. an angle with respect to a central axis of the vehicle or the current driving direction, of each object for which a collision hazard is detected with respect to the current position of the vehicle 200. The collision hazard information may also comprise an object description including one or several object properties such as object type, object dimensions, longitudinal distance, i.e. in driving direction, lateral distance, i.e. perpendicular to the driving direction, speed vector, acceleration vector, and the like. The object type may include an object classification such as car, truck, motorcycle, bicycle, pedestrian, tree, traffic sign and so on. The object type may for instance be identified from image data captured by a camera of the vehicle 200 using pattern recognition techniques, possibly including a determination of a state of motion (stationary, moving) of the object.

Pattern recognition techniques may also be applied to distinguish between a motorized vehicle such as the motorcycle 294 and an outside traffic participant such as a cyclist 291 and pedestrians 292. While drivers of motorcycles and other motorized vehicles will likely be less influenced by the emitted synthetic external sound, due to the intrinsic noise level of their vehicle and the sound insulation of the passenger cabin or the helmet, cyclists and pedestrians are the main target of the intended warning of an approaching vehicle. As such, the object type may be used by the sound processing unit to enhance the audio signal only when a collision hazard between the vehicle 200 and such an outside traffic participant is detected. Also, a distinction may be made between inanimate objects such as trees or a parked vehicle 293 and persons such as cyclists and pedestrians. Here, face detection algorithms may be applied to captured image data and/or infrared measurements may be used to identify human beings. A plurality of alternative methods may be used to identify outside traffic participants who are the main target of the present warning system.

Based on a comparison between currently captured data and past data, the object tracking unit may track objects in the surroundings of the vehicle. Even objects, for which no collision hazard was detected, are tracked such that a newly occurring collision hazard, e.g. due to a changed course of a road user, may be reliably detected. A Kalman filter may be used to recognize erroneous conclusions.

In addition to tracking those objects for which a collision hazard has been detected, the object tracking unit 435 may further keep track of the motion of the vehicle 200 itself, for instance by receiving corresponding vehicle position data from a navigation system of the vehicle 200. As a consequence, the object tracking unit 435 may update the relative position of the tracked objects and the vehicle such that a steered emission of synthetic external sound can always be directed at the current position of the respective road user.

The hazard analysis unit 330 may further monitor a detected collision hazard by repeatedly calculating the probability of a collision based on updated positional and/or motional information. As a result, an existing collision hazard may be resolved if the probability drops below a lower threshold and the sound emission may be reduced back to background levels.

The described collision hazard detection may further specify a minimum range, i.e. distance from the vehicle 200, of the sector which is scanned for collision hazards. This minimum range may in particular be chosen to correspond to a minimal distance between the vehicle 200 and a road user in which a warning gives the road user enough time for countermeasures to avoid a collision. Assuming moderate circumstances, e.g. a reaction time of 2.5 sec by the vehicle operator, an average deceleration of 3 m/s$^2$ (overdue tires, winter conditions), the minimal required safety distance between a stationary object and a vehicle at a speed of 30 km/h is approximately 35 m. The minimal operating range of a reliable warning system may therefore be chosen to be greater or equal to the speed-dependent safety distance, preferably 1.5 times the safety distance, most preferably twice the safety distance.

Based on the collision hazard information received from the hazard analysis unit 330, the sound processing unit 320 modifies a basic audio signal to enhance the perceptibility of the emitted synthetic external sound and controls the one or more electroacoustic transducers to emit a corresponding un-steered and/or steered sound wave.

Figure 5:
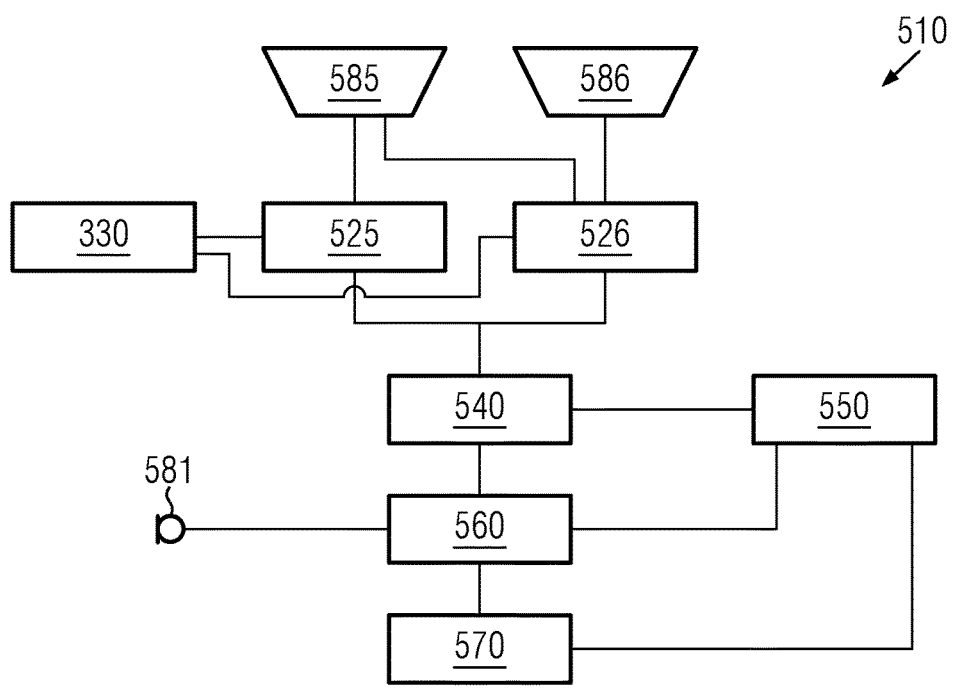
FIG. 5 shows an exemplary variant of the system for the synthesis of external sound of a vehicle according to the present disclosure.

FIG. 5 shows a more comprehensive variant of the system for the synthesis of external sound of a vehicle according to the present disclosure. In this variant, the electroacoustic transducers 380 of the external sound synthesis system 510 comprise one or more un-steered electroacoustic transducers 585 and one or more steered electroacoustic transducers 586. As described above, un-steered electroacoustic transducers are characterized by a fixed emission characteristics for each individual transducer while steered electroacoustic transducer can change their emission characteristics, for instance by mechanical actuation. Typical examples for un-steered electroacoustic transducers are loudspeakers which are statically mounted on the vehicle 200. Although un-steered electroacoustic transducers can also be used for the emission of a steered sound wave, e.g. by beamforming using two or more spatially separated loudspeakers, the steered electroacoustic transducers possess an inherent capability of emitting a sound wave in a particular direction which may be changed for each electroacoustic transducer individually.

An example for a steered electroacoustic transducer is given by a loudspeaker whose acoustic axis can be steered toward an object by mechanic tracking or turning of the loudspeaker. A steering and focusing effect can also be achieved by using a parabolic acoustic reflector and pointing an un-steered loudspeaker toward the reflector. The reflected sound is hereby focused and may be steered toward an object by mechanically turning the parabolic reflector. Also, ultrasonic loudspeakers have a good focus behavior based on the small wavelengths used. Using a suitable modulated signal and the nonlinear propagation property of air, which depends on the sound level, the humidity and the pressure, it is possible to generate an audible sound along the acoustic axis of the loudspeaker with good crosstalk characteristic. The acoustic axis may then be pointed at the object by mechanically turning the ultrasonic loudspeaker. Finally, a so-called electro dynamic planar loudspeaker (EDPL) may be used. An electro dynamic planar loudspeaker is a flat loudspeaker with Neodymium-magnet strips mounted in a well defined geometrical layout on a carrier. In order to generate a homogeneous and thereby focused sound, the electrical signal is conducted through a meandering course trace embedded in an interlayer such that the complete area is stimulated. A steering can be achieved by turning the carrier.

A large number of alternatives are available in the art for both steered and un-steered electroacoustic transducers. By way of example, transducers with an eccentric emission axis, transducers with a horn/cone design and the like may be used to achieve directional emission characteristics. The electroacoustic transducers may be mechanically or electrically actuated to turn the emission in the direction of the tracked object. As mentioned above, the electroacoustic transducers may be integrated in the apron or bumper of the vehicle to be protected from splash water. Weatherproof mini loudspeakers may also be placed inside the wheel well of the vehicle.

According to the variant illustrated in FIG. 5, the sound processing unit 320 includes an un-steered sound processing unit 525 and a steered sound processing unit 526. Both the un-steered sound processing unit 525 and the steered sound processing unit 526 may receive collision hazard information from the hazard analysis unit 330. Based on the collision hazard information, the sound processing units 525 and 526 may modify an audio signal output to the respective electroacoustic transducers 585 and 586 to enhance the perceptibility of the emitted synthetic external sound. By way of example, the un-steered sound processing unit 525 may be configured to output the unmodified audio signal to one or more un-steered electroacoustic transducers 585 to emit a basic underlying un-steered synthetic external noise. Upon reception of collision hazard information indicating the detection of a collision hazard, the un-steered sound processing unit 525 may modify the audio signal, e.g. by amplifying the entire audio signal or selected spectral components thereof, and control the un-steered electroacoustic transducers 585 to output an un-steered synthetic external sound with enhanced perceptibility. The gain factors applied by the un-steered sound processing unit 585 may depend on the relative distance between a tracked object and the vehicle 200 as well as the speed $v_1$ of the vehicle 200.

Alternatively or additionally, the steered sound processing unit 526 may be configured to modify the audio signal such that a steered audio wave is emitted in the direction of the tracked object. To this end, the steered sound processing unit 526 may extract the corresponding direction information from the collision hazard information received from the hazard analysis unit 330 and control the mechanical or electrical actuators of the one or more steered electroacoustic transducers 586 to turn their emission direction in the direction of the tracked object. Furthermore, the steered sound processing unit 526 may modify the audio signal by amplifying the entire signal or selected spectral components thereof. As an alternative to the mechanical/electrical turning of steered electroacoustic transducers 586, the steered sound processing unit 526 may also modify two or more channels of a multi-channel audio signal to be emitted by two or more spatially separated un-steered electroacoustic transducers 585. The steered sound processing unit 526 may apply suitable delays or phase shifts or filter the individual channels to achieve a constructive superposition of the emitted sound waves at the location of the tracked object. An advantage of this beamforming method lies in the possibility of quickly adapting the direction of the emitted signal without moving any mechanical parts. Also, the modified channels can be superposed onto an underlying un-steered audio signal such that the perceptibility of the synthetic external sound may be enhanced by simply adding a steered audio signal component to the un-steered basic audio signal. Furthermore, beamforming may be performed with respect to more than one direction even if only two loudspeakers are present.

Consequently, even complex traffic situations as the one shown in FIG. 2 may be handled without needing a large number of electroacoustic transducers.

The external sound synthesis system 510 of FIG. 5 further comprises metadata unit 540 which preprocesses the basic audio signal before supplying it to the sound processing units 525 and 526. The metadata unit 540 receives vehicle metadata such as a time of day, a date, vehicle position data and traffic sign data from existing components, in particular from a head unit 550, of the vehicle 200. Based on the time of day and optionally the date and/or vehicle position data, the metadata unit 540 may distinguish between day and nighttime. At a particular time, e.g. between 12 am and 5 am, the metadata unit 540 may attenuate the audio signal to reduce the overall noise pollution. Alternatively, the metadata unit 540 may amplify the audio signal at nighttime to compensate for the reduced visibility at night. Based on vehicle position data, e.g. received from a GPS sensor of the vehicle, and map data from a navigation system of the vehicle, the metadata unit 540 can determine whether the vehicle is currently positioned in a traffic calmed area or a noise protected area. If this is the case, the audio signal may be attenuated to avoid prohibited or unnecessary noise pollution. Such a traffic calmed area or noise protected area may also be detected from traffic sign data which is provided by the head unit 550 after processing image data captured by the front view camera 282a.

In general, the metadata unit 540 determines whether a special time and/or location related situation is present which makes a reduction of noise emissions necessary or desirable, e.g. according to legal regulations. If such a situation is detected, the metadata unit 540 attenuates the entire audio signal or selected spectral components thereof to reduce the overall noise pollution, in particular if no critical situation is expected.

The system according to FIG. 5 further includes a noise processing unit 560 which preprocesses the basic audio signal before outputting it to the metadata unit 540. The noise processing unit 560 receives information on an external noise level and/or spectrum from one or more external microphones 581 and vehicle data such as speed, gear information and direction (forward/backward) from the head unit 550 of the vehicle 200. Based on the vehicle data, the noise processing unit 560 may estimate the external noise. The estimated environmental noise may be calculated by subtracting the known and filtered synthetic noise signal resulting from the synthetic external sound emission from the measured external noise signal. Optionally, the estimation may be supported by standardized noise measurements stored in a database of the synthetic external sound system containing noise levels due to wind friction and tire roll off based on different vehicle speeds.

The noise processing unit 560 may then amplify the entire audio signal or only selected spectral components of the audio signal based on the estimated environmental noise signal. As mentioned above, gain factors applied by the noise processing unit 560 to the basic audio signal may be 1 below a minimum external noise level and increase with the measured external noise level above this threshold. The noise processing unit 560 may further apply a psychoacoustic model to the basic audio signal to balance the loudness of the synthetic external sound with respect to the characteristics of the human hearing.

By taking environmental noise levels and distributions into account, the described system can improve the perceptibility of the emitted synthetic external sound by other road users.

Finally, the system according to FIG. 5 further includes an external sound generation unit 570 which generates a predefined basic audio signal which represents the sound image of the particular vehicle type, make and/or model. The basic audio signal may be read from a nonvolatile memory or any other storage medium or may be generated based on vehicle data such as speed, longitudinal acceleration, gear information, engine speed (rpm), load (torque, throttle) to provide the illusion of the sound of a combustion engine matching the brand image of the vehicle. The vehicle data is received from the head unit 550 of the vehicle 200. The generated basic audio signal forms the basis for the above described sound processing by the sound processing unit and is output to the noise processing unit 560 according to the variant of FIG. 5.

Figure 6:
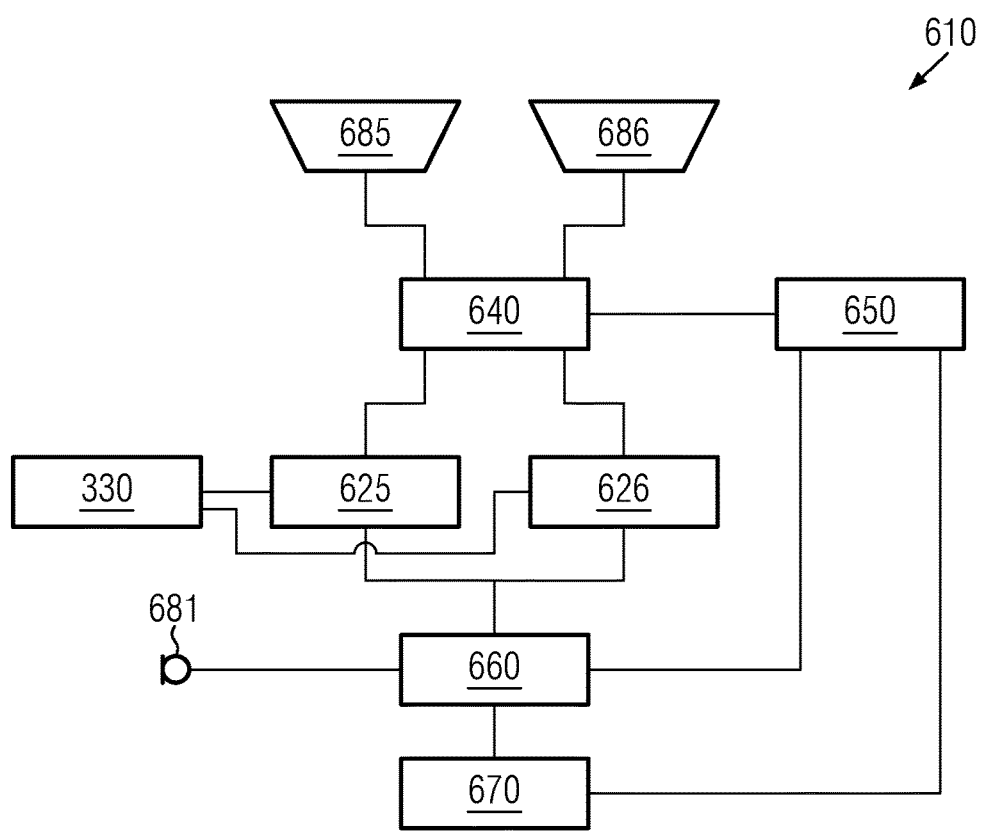
FIG. 6 shows an alternative variant of the system in FIG. 5.

An alternative variant of the external sound synthesis system of FIG. 5 is shown in FIG. 6. Design and functionality of the un-steered electroacoustic transducers 685, the steered electroacoustic transducers 686, the un-steered sound processing unit 625, the steered sound processing unit 626, the head unit 650, the noise processing unit 660, the external sound generation unit 670 and the external microphones 681 correspond to the respective components of the system in FIG. 5 and are therefore not described again. The metadata unit 640 according to the variant of the system 610 in FIG. 6 is, however, located at a different logical position with respect to the sound processing units than in FIG. 5. While the noise processing unit 660 inputs a preprocessed basic audio signal to the sound processing units 625 and 626, the metadata unit 640 receives audio signals from both the un-steered sound processing unit 625 and the steered sound processing unit 626. As a consequence, the un-steered and steered audio signal components may be attenuated independently from each other. By way of example, the un-steered audio signal component may be attenuated by the metadata unit 640 upon detection of a special time and/or location related situation while the steered audio signal components remain unaffected. Thus, the overall noise pollution may be reduced without compromising the safety of other road users such as pedestrians.

The hazard analysis unit, the sound processing units, the metadata unit, the noise processing unit and the external sound generation unit may be embodied as physically separated hardware components, such as digital signal processors, or as modules of a single processor, in particular a single digital signal processor. Also, the above listed components may be arranged as modules of a processor of the head unit of the vehicle 200.

Figure 7:
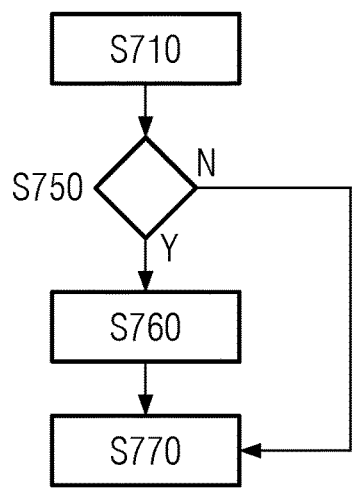
FIG. 7 illustrates the principle of the method for the synthesis of external sound of a vehicle according to the present disclosure.

FIG. 7 illustrates the principle of the method for the synthesis of external sound of a vehicle according to the present disclosure. In a first step S710, an audio signal representing an, in particular vehicle dependent, synthetic noise signal is generated. Depending on whether or not a collision hazard between the vehicle and a further road user is detected in step S750, the audio signal is modified in step S760 to enhance its perceptibility by the further road user or not. Consequently, the modified or unmodified audio signal is output as a synthetic external sound by at least one electroacoustic transducer in step S770.

Figure 8:
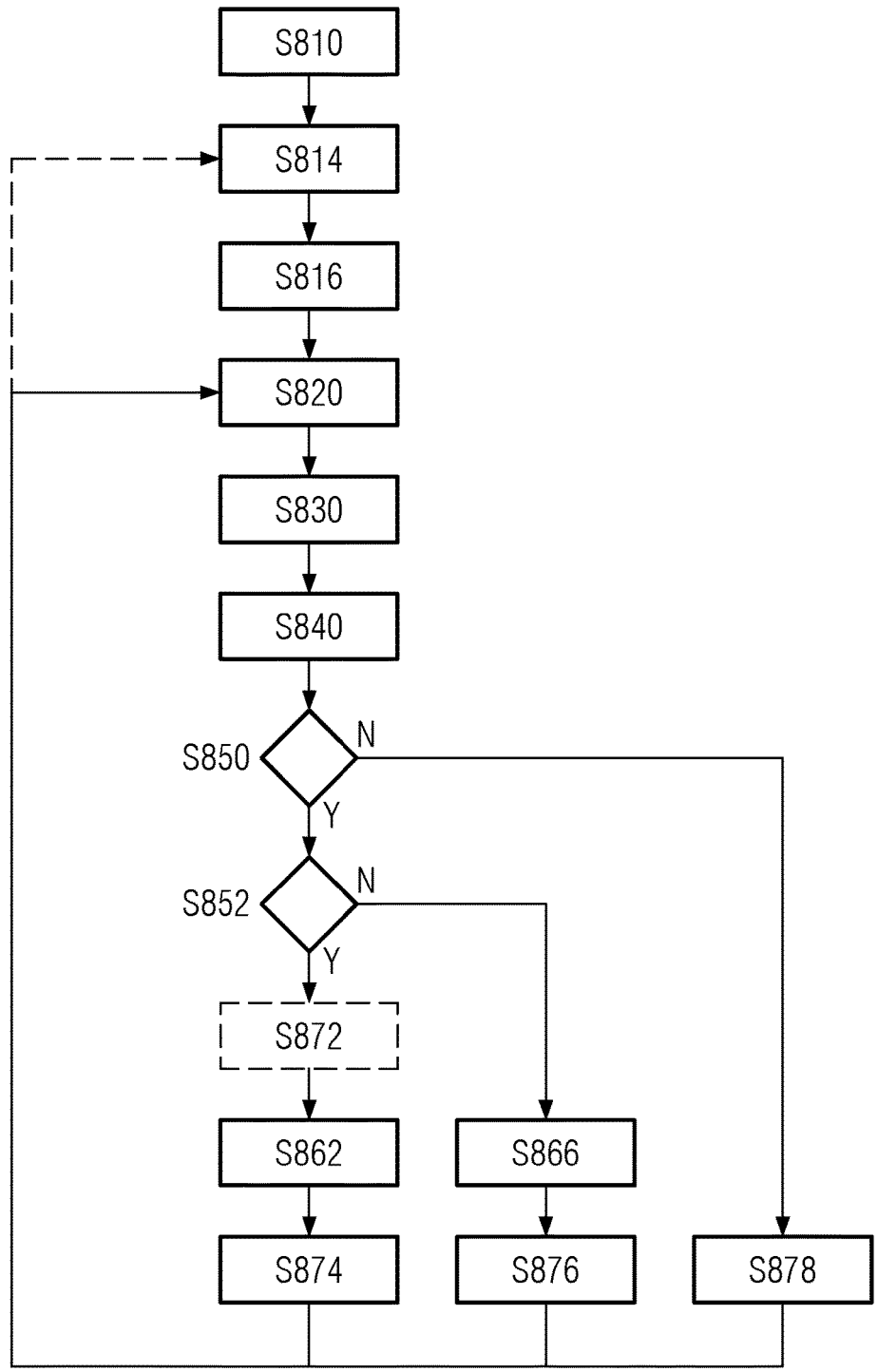
FIG. 8 shows an exemplary embodiment of the method in FIG. 7.

A more comprehensive variant of the method for the synthesis of external sound is depicted in FIG. 8. Following the generation of a basic audio signal representing a vehicle dependent synthetic noise signal in step S810, the audio signal is selectively amplified in accordance with a measured external noise level in step S814 as described above. The preprocessed audio signal is then selectively attenuated in step S816 if a special time and/or location related situation is detected. The attenuation S816 may be skipped or limited in case the hazard analysis detects a collision hazard. As a consequence, step S816 may alternatively or additionally be located in the 'N'-branch of step S850. In step S820, data is captured from objects in the surroundings of the vehicle by at least one sensor, from which positional and/or motional information of at least one object is determined in step S830 as described above. Based on the determined positional and/or motional information, a hazard analysis to detect a collision hazard is performed in step S840. If no collision hazard is detected in step S850, an unmodified audio signal resulting from the preprocessing in steps S814 and S816 is output via un-steered electroacoustic transducers in step S878.

If at least one collision hazard is detected or prevails in step S850, it is determined in step S852 whether a steered audio signal shall be output. If no steered audio signal is to be output, the un-steered audio signal is enhanced in step S866 and output via one or more un-steered electroacoustic transducers in step S876. If a steered audio signal is to be output, an enhanced un-steered audio signal component may be generated in optional step S872 which may be output together with the steered audio signal component. In step S862, a steered audio signal component is generated which may in particular be amplified with respect to the unmodified audio signal. Any one of the above described methods for steering an audio emission in the direction of the further road user may be applied. In step S874, a steered audio signal is output in the direction of one or several other road users using one or more steered electroacoustic transducers and/or via beamforming using two or more un-steered electroacoustic transducers as described above.

From the output of the audio signal in steps S874, S876 and/or S878, the algorithm loops back to capturing data from objects in the vehicle's surroundings in step S820 or to selectively amplifying the audio signal based on information about an external noise level and/or spectrum in step S814. It shall be understood, that the depicted process is a continuous process, in which all of the looped steps may be executed in parallel on a sequence of audio data to emit a time varying synthetic noise signal which takes into account the current traffic situation and external noise level.

The described systems and methods allow for an increased safety of outside traffic participants without unduly increasing noise emissions from electric/hybrid vehicles. It therefore serves the green image of this class of vehicles while increasing the acceptance by other road users.

The invention claimed is:

1. A system for synthesis of external sound of a vehicle, the system comprising:
   a hazard analysis unit configured to detect a collision hazard between the vehicle and at least one further road user, in particular an outside traffic participant;
   at least one electroacoustic transducer; and
   a sound processing unit configured to generate an audio signal representing an, in particular vehicle dependent, synthetic noise signal and to control the at least one electroacoustic transducer to output a synthetic external sound based on the audio signal,
   wherein the sound processing unit is configured to modify the audio signal to enhance a perceptibility of the synthetic external sound by the further road user upon detection of the collision hazard,
   wherein the hazard analysis unit comprises at least one sensor configured to capture data from objects in surroundings of the vehicle and an object tracking unit configured to determine at least one of positional and motional information of at least one object in the surroundings of the vehicle from the captured data,
   wherein the hazard analysis unit is configured to detect the collision hazard between the vehicle and the further road user based on the determined at least one of positional and motional information, wherein a sector of the surroundings of the vehicle which the hazard analysis unit scans for objects is limited to a cone with an opening angle, which depends on a current speed of the vehicle, and with an axis in a current driving direction of the vehicle.

2. The system according to claim 1, wherein the sound processing unit is configured to modify at least one of a volume, a spectral distribution, a phase, a directivity and a temporal variation of the synthetic external sound through modification of the audio signal.

3. The system according to claim 1, wherein the sound processing unit comprises an un-steered sound processing unit configured to control the at least one electroacoustic transducer to output an un-steered synthetic external sound based on the modified audio signal upon detection of the collision hazard.

4. The system according to claim 1, wherein the sound processing unit comprises a steered sound processing unit configured to control the at least one electroacoustic transducer to output a steered synthetic external sound in a direction of the further road user based on the modified audio signal and the determined positional and/or motional information upon detection of the collision hazard.

5. The system according to claim 1, wherein the sound processing unit comprises a metadata unit configured to selectively attenuate the audio signal based on vehicle metadata;
wherein the vehicle metadata includes at least one of a time, a date, vehicle position data and traffic sign data.

6. The system according to claim 5, wherein the metadata unit is configured to reduce an amplitude of the entire audio signal or of selected spectral components of the audio signal based on the vehicle metadata.

7. The system according to claim 1, wherein the sound processing unit comprises a noise processing unit configured to selectively amplify the audio signal based on information about an external noise level.

8. A method for synthesis of external sound of a vehicle, the method comprising:
generating an audio signal representing an, in particular vehicle dependent, synthetic noise signal;
performing a hazard analysis to detect a collision hazard between the vehicle and at least one further road user, in particular an outside traffic participant;
controlling at least one electroacoustic transducer of the vehicle to output a synthetic external sound based on the audio signal;
capturing data from objects in surroundings of the vehicle by at least one sensor; and
determining at least one of positional and motional information of at least one object in the surroundings of the vehicle from the captured data,
wherein the collision hazard between the vehicle and the further road user is detected based on the determined at least one of positional and motional information,
wherein the audio signal is modified to enhance a perceptibility of the synthetic external sound by the further road user upon detection of the collision hazard, and
wherein a sector of the surroundings of the vehicle which is scanned for objects is limited to a cone with an opening angle, which depends on a current speed of the vehicle, and with an axis in a current driving direction of the vehicle.

9. The method according to claim 8, wherein the perceptibility of the synthetic external sound is enhanced by modifying at least one of a volume, a spectral distribution, a phase, a directivity and a temporal variation of the synthetic external sound through modification of the audio signal.

10. The method according to claim 8, further comprising:
controlling the at least one electroacoustic transducer of the vehicle to output a steered synthetic external sound in a direction of the further road user based on the modified audio signal and the determined positional and/or motional information upon detection of the collision hazard.

11. The method according to claim 8, further comprising:
selectively attenuating the audio signal based on vehicle metadata,
wherein the vehicle metadata includes at least one of a time of day, a date, vehicle position data and traffic sign data.

12. The method according to claim 11, wherein the entire audio signal or selected spectral components of the audio signal are attenuated based on the vehicle metadata.

13. The method according to claim 8, further comprising:
selectively amplifying the audio signal based on information about an external noise level.

* * * * *